United States Patent
May et al.

[19]

[11] Patent Number: 5,966,054
[45] Date of Patent: *Oct. 12, 1999

[54] METHOD AND APPARATUS FOR PROVIDING A CLOCKING SIGNAL

[75] Inventors: Michael R. May, Austin; Michael D. Cave, Pflugerville; Joseph C. Fong, Austin, all of Tex.

[73] Assignee: Motorola, Inc., Schaumburg, Ill.

[*] Notice: This patent issued on a continued prosecution application filed under 37 CFR 1.53(d), and is subject to the twenty year patent term provisions of 35 U.S.C. 154(a)(2).

[21] Appl. No.: 09/015,846

[22] Filed: Jan. 29, 1998

[51] Int. Cl.[6] .................. H03B 5/04; H03B 5/36

[52] U.S. Cl. ............ 331/177 R; 331/158; 331/175; 331/177 V; 331/179

[58] Field of Search .................. 331/36 C, 116 R, 331/116 FE, 158, 175, 177 R, 177 V, 179

[56] References Cited

U.S. PATENT DOCUMENTS

| | | | |
|---|---|---|---|
| 4,328,581 | 5/1982 | Harmon et al. | 371/8 |
| 4,827,226 | 5/1989 | Connell | 331/116 FE |
| 4,833,706 | 5/1989 | Hughes-Hartogs | 379/98 |
| 5,245,646 | 9/1993 | Jackson et al. | 377/2 |
| 5,309,503 | 5/1994 | Bruckert et al. | 379/60 |
| 5,400,322 | 3/1995 | Hunt et al. | 370/19 |
| 5,446,420 | 8/1995 | Westwick | 331/179 |
| 5,475,864 | 12/1995 | Hamabe | 455/33.1 |
| 5,479,447 | 12/1995 | Chow et al. | 375/260 |
| 5,548,819 | 8/1996 | Robb | 455/59 |
| 5,596,604 | 1/1997 | Cioffi et al. | 345/260 |
| 5,598,435 | 1/1997 | Williams | 375/261 |
| 5,603,082 | 2/1997 | Hamabe | 455/33.1 |

OTHER PUBLICATIONS

Alliance for Tellecommunications Industry Solutions, "Asymmetric Digital Subscriber Line (ADSL) Metallic Interface", Draft American National Standard for Telecommunications, Network and Customer Installation Interfaces, T1E1.4/94–007R7, pp. i–xii and pp. 2–171

Chow, et al., "A Practical Discrete Multitone Tranceiver Loading Algorithm for Data Transmission over Spectrally Shaped Channels", IEEE Transactions on Communications, vol. 43, No. 2/3/4, pp. 773–775 (1995).

Cioffi, "DMT Information Bus for Multidrop Interface on Existing Wiring", T1E1.4/94–126, pp. 1–6 (1994).

Levin, et al., U.S. Appl. No. 08/660,380 filed on Jun. 7, 1996.

Levin, U.S. Appl. No. 08/937,759 filed on Sep. 25, 1997.

Levin, U.S. Appl. No. 08/660,399 filed on Jul. 7, 1996.

*Primary Examiner*—David Mis
*Attorney, Agent, or Firm*—Jeffrey G. Toler

[57] ABSTRACT

A method that includes the steps of producing a digital code (104) based at least in part on an integrated circuit capacitance and adjusting a frequency of the clocking signal in response to the digital code (106). A method that includes the steps of in a first mode of operation, producing a fixed frequency clocking signal, the fixed frequency clocking signal having a frequency tolerance less than 20 units per million and, in a second mode of operation, producing a variable frequency clocking signal, the variable frequency clocking signal having a frequency variability range greater than 200 units per million. An apparatus for providing a clocking signal includes a tuner circuit (12) and an oscillator circuit (16) responsive to the tuner circuit (12). The tuner circuit (12) is responsive to a clock signal source (38), an integrated circuit capacitance, and a reference resistor (18). The tuner circuit (12) produces a digital code signal. (22) The oscillator circuit (16) includes at least one adjustable integrated circuit capacitor (30, 32) responsive to the digital code signal (22) and is capable of producing the clocking signal.

20 Claims, 2 Drawing Sheets

METHOD AND APPARATUS FOR PROVIDING A CLOCKING SIGNAL

FIELD OF THE INVENTION

The present invention relates to methods and apparatus for providing clocking signals.

BACKGROUND OF THE INVENTION

Many current clocking circuits are available. One type of clocking circuit can provide a clocking signal having a variable frequency. Such variable frequency clocking circuits, also referred to as voltage controlled crystal oscillators, are used in many commercial applications, such as in wireless communications devices. While such variable frequency clocking circuits have many useful applications due to the programmable nature of the frequency, these circuits typically have a relatively high variability in the nominal frequency of oscillation due to process variation of integrated circuit capacitance inherent in the manufacturing process of semiconductive devices.

Another type of clocking circuit is a fixed frequency oscillator. Such fixed frequency oscillators do not offer programmable frequency clocking signals but do provide a clock signal with higher accuracy than the variable frequency clocking circuits. One reason for the higher accuracy is that these circuits use capacitors that are separate from the integrated circuit, i.e. off-chip capacitors.

Certain commercial applications would benefit from or may be enabled by a method and apparatus for providing a variable frequency clocking signal that also has higher accuracy at its nominal frequency. One such application is asynchronous digital subscriber loop (ADSL) systems that are under development in the data communication technology area. For example, a technology standard "Network and Customer Installation Interfaces of the Alliance for Tellecommunications Industry Solutions for the ADSL Metallic Interface" (T1E1.413) requires a frequency tolerance of at most +/−50 parts per million with software selectability of frequency in response to a far-end modem request.

Accordingly, there is a need for an improved method and apparatus for providing a clocking signal with variable frequency and high accuracy nominal frequency.

BRIEF DESCRIPTION OF THE DRAWINGS

While the invention is pointed out with particularity in the appended claims, other features of the invention are disclosed by the following detailed description in conjunction with the accompanying drawings, in which:

DETAILED DESCRIPTION OF THE PREFERRED EMBODIMENTS(S)

Generally, the present invention relates to a method and apparatus for providing a clocking signal. In accordance with a particular embodiment, the method includes the steps of producing a digital code based at least in part on an integrated circuit capacitance and adjusting a frequency of the clocking signal in response to the digital code.

In accordance with another aspect of the present invention, the method includes the steps of in a first mode of operation, producing a fixed frequency clocking signal, the fixed frequency clocking signal having a frequency tolerance less than 20 units per million and in a second mode of operation, producing a variable frequency clocking signal, the variable frequency clocking signal having a frequency variability range greater than 200 units per million.

In accordance with another aspect of the present invention, the apparatus for providing a clocking signal includes a tuner circuit and an oscillator circuit responsive to the tuner circuit. The tuner circuit is responsive to a clock signal source, an integrated circuit capacitance, and a reference resistor. The tuner circuit produces a digital code signal. The oscillator includes at least one adjustable integrated circuit capacitor responsive to the digital code signal and is capable of producing the clocking signal.

It should be noted that the particular terms and expressions employed and the particular structural and operational details disclosed in the detailed description and accompanying drawings are for illustrative purposes only and are not intended to in any way limit the scope of the invention as described in the appended claims.

Figure 1:
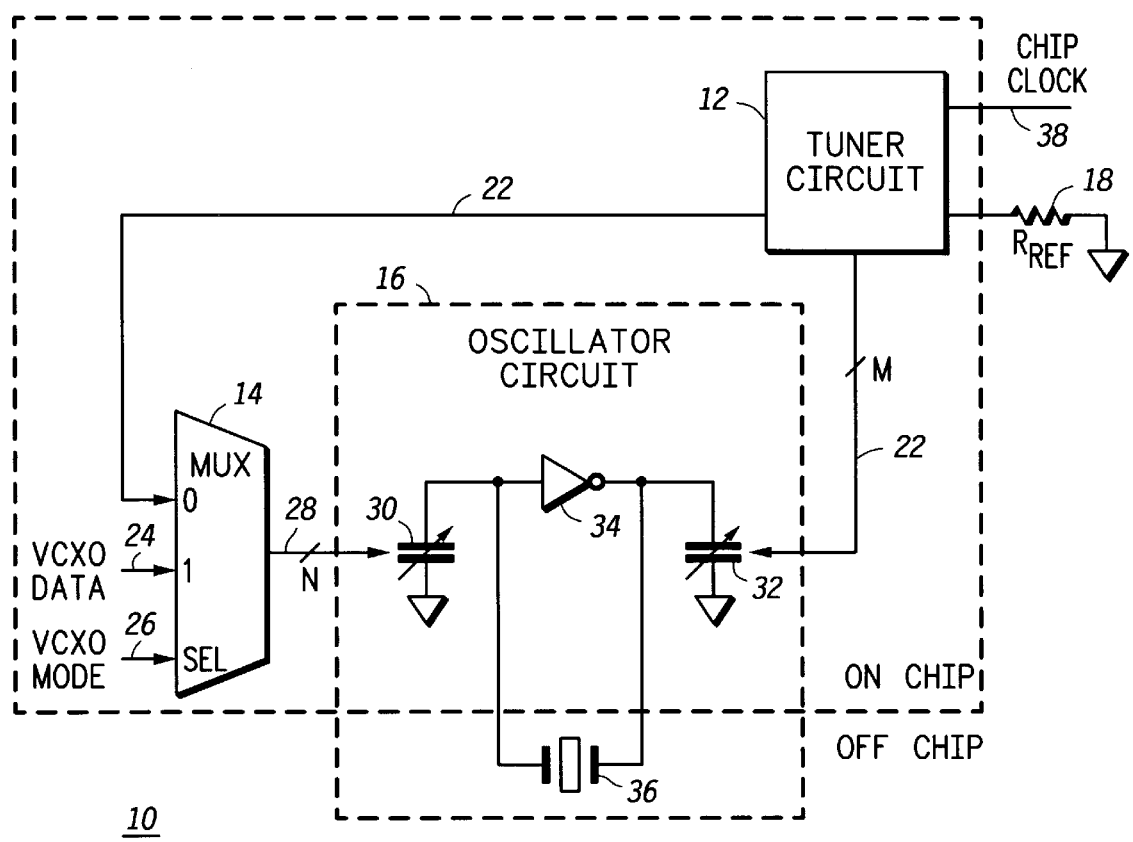
FIG. 1 is a block diagram of an embodiment of an apparatus for providing a clocking signal in accordance with the present invention.

Referring to FIG. 1, an embodiment of an apparatus for providing a clocking signal is disclosed. The apparatus 10 includes a tuner circuit 12, an oscillator circuit 16 and a multiplexer 14. The oscillator circuit 16 is responsive to the tuner circuit 12 and the multiplexer 14. The tuner circuit 12 is responsive to a reference resistor 18 and a clocking source signal 38. The tuner circuit 12 in one embodiment is the tuner circuit disclosed in U.S. Pat. No. 5,245,646, which is incorporated by reference herein [please send me copy of patent]. The tuner circuit 12 produces a digital code signal 22 at its outputs. The digital code signal 22 is indicative of a resistance and integrated circuit capacitance (RC) time constant. The resistor for the time constant is the reference resistor 18 and the capacitance for the time constant is the on chip capacitance of the integrated circuit. The tuner circuit 12 also uses the chip clock signal 38 to produce the digital code signal 22. Since the digital code signal 22 is based at least in part on the integrated circuit capacitance, this signal 22 can be used to adjust and correct for process variations among integrated circuits leading to differing capacitances across different integrated circuit devices.

The oscillator circuit 16 includes a first variable capacitor 30, a second variable capacitor 32, a crystal oscillator 36, and a driver 34. The driver 34 is responsive to the first variable capacitor and drives the second variable capacitor 32. The driver 34 is in a parallel circuit arrangement with the crystal oscillator 36, the oscillator circuit 16 provides a clocking signal having a selected frequency. The frequency of the clocking signal may be varied by changing the capacitance of the first and/or the second variable capacitors 30, 32. The multiplexer 14 receives variable frequency data 24, such as voltage controlled oscillator data, the digital code signal 22 from the tuner circuit 12, and a mode select control signal 26. The multiplexer 14 outputs either the digital code signal 22 in the first mode of operation or the variable frequency data signal 24 in the second mode of operation at its output 28 depending on the mode control signal 26.

In a particular illustrative embodiment, the driver 34 is an inverting amplifier type of driver implemented as an inverter. The crystal oscillator 36 is a model no. A455FEG8-13 type of oscillator available from Conner-Winfield Corp., Aurora, Ill. The multiplexer 14 is an N-bit type of multiplexer.

Figure 2:
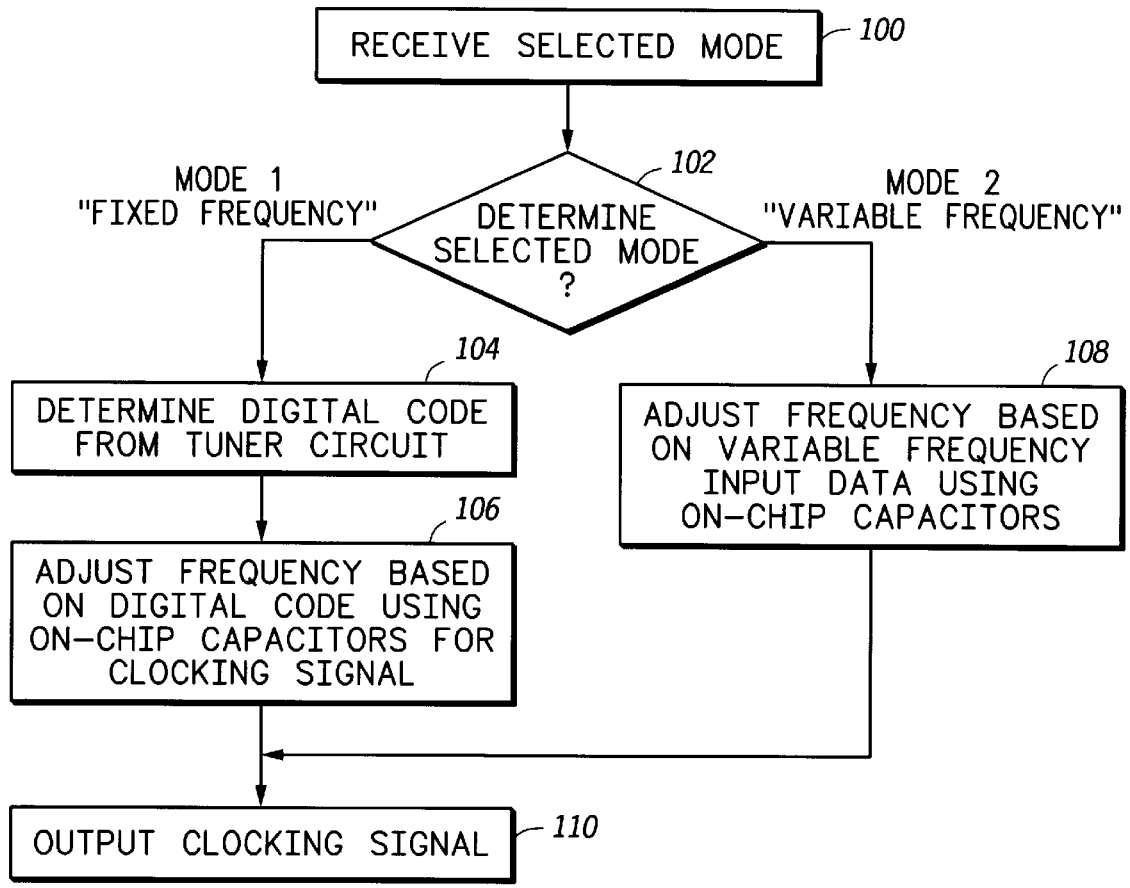
FIG. 2 is a flow chart illustrating operation of the apparatus of FIG. 1.

Operation of the apparatus 10 will now be described in reference to the flow chart of FIG. 2. A selected mode of operation is received, at step 100. The selected mode of operation is determined, at 102. In the case that the first mode of operation is selected, e.g. the fixed frequency mode, the digital code signal 22 is received at the oscillator circuit 16 from the tuner circuit 12, step 104. A clocking signal is produced at the oscillator circuit 16 with an adjusted frequency based on the digital code signal 22 by using variable capacitors 30 and 32, step 106. The clocking signal with the adjusted frequency is output, at step 110. In this first mode of operation, the clocking signal has a frequency tolerance less than 60 parts per million, preferably less than 50 parts per million, and most preferably at a level of less than about 10 part per million. Many conventional variable frequency capable oscillators have a frequency tolerance level of greater than 100 parts per million. Thus, the first mode of operation provides a substantially fixed frequency with very high frequency stability and frequency tolerance.

If the second mode of operation was selected, then the frequency of the clocking signal is adjusted based on input data 24 using the variable capacitors 30 and 32, step 108. In certain applications, the digital code signal 22 may also be used to adjust the capacitors 30 and 32 in the second mode of operation. The clocking signal with the adjusted frequency is then output, at step 110. In the second mode of operation, a key performance parameter is frequency variability range. In the embodiment disclosed in FIG. 1 has a frequency variability range greater than 200 parts per million and preferably greater than about 275 parts per million. Thus, the above apparatus and method for providing a clocking signal has beneficial frequency range performance in the second mode of operation while providing improved frequency tolerance in the first mode of operation.

Thus, there has been described herein an embodiment including at least one preferred embodiment of a method and apparatus for providing a clocking signal. It will be apparent to those skilled in the art that the disclosed subject matter may be modified in numerous ways and may assume many embodiments other than the preferred form specifically set out and described above.

Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

What is claimed is:

1. A method of providing a clocking signal comprising the steps of:
    producing a digital code based at least in part on an integrated circuit capacitance; and
    adjusting a frequency of the clocking signal in response to the digital code.

2. The method of claim 1, wherein the digital code is further based on a signal from a clock source and a reference resistor.

3. The method of claim 1, wherein the clocking signal is produced by a clocking circuit and wherein the step of adjusting the frequency of the clocking signal further comprises adjusting the frequency of the clocking signal by at least one of adding and subtracting at least one capacitor to the clocking circuit during a first mode of operation.

4. The method of claim 3, wherein during a second mode of operation, the clocking signal is provided by the clocking circuit without adjusting the frequency based on the digital code.

5. The method of claim 4, wherein the first mode is a free-running oscillator mode and the second mode is a voltage controlled oscillator mode.

6. The method of claim 1, wherein the integrated circuit has an oxide thickness relating to an integrated circuit capacitance and wherein the digital code is indicative of the integrated circuit capacitance.

7. The method of claim 1, further comprising the step of applying the clocking signal to an end terminal of an asynchronous digital subscriber loop communication system.

8. An apparatus for providing a clocking signal, the apparatus comprising:
    a tuner circuit responsive to a clock signal source, an integrated circuit capacitance, and a reference resistor, the tuner circuit producing a digital code signal; and
    an oscillator circuit responsive to the tuner circuit, the oscillator circuit including at least one adjustable integrated circuit capacitor responsive to the digital code signal, the oscillator circuit capable of producing the clocking signal.

9. The apparatus of claim 8, wherein the digital code signal is indicative of a time constant corresponding to the integrated circuit capacitance and the reference resistor.

10. The apparatus of claim 8, further comprising a multiplexer responsive to the tuner circuit and in communication with the oscillator circuit.

11. The apparatus of claim 8, wherein the clocking signal has a frequency that is adjusted with a frequency offset based on the digital code.

12. The apparatus of claim 8, wherein the oscillator circuit includes a first adjustable capacitor, an inverter, a second adjustable capacitor, and a crystal oscillator.

13. The apparatus of claim 12, wherein the first adjustable capacitor is responsive to an output of a multiplexer and the second adjustable capacitor is responsive to the tuner circuit.

14. The apparatus of claim 13, wherein the multiplexer is responsive to the tuner circuit and wherein the multiplexer selects between a first mode of operation and a second mode of operation.

15. The apparatus of claim 14, wherein the clocking signal has a frequency that is adjusted with a frequency offset based on the digital code in the first mode of operation but does not have its frequency adjusted in the second mode of operation.

16. The apparatus of claim 8, wherein the tuner circuit is disposed in an integrated circuit but the reference resistor is disposed outside of the integrated circuit.

17. A method of providing a clocking signal comprising the steps of:
    in a first mode of operation, producing a fixed frequency clocking signal, the fixed frequency clocking signal having a frequency variability less than 60 units per million; and
    in a second mode of operation, producing a variable frequency clocking signal, the variable frequency clocking signal having a frequency variability range greater than 200 units per million.

18. The method of claim 17, wherein the frequency variability in the first mode of operation is less than 50 units per million.

19. The method of claim 18, wherein the frequency variability in the first mode of operation is less than 10 units per million.

20. The method of claim 17, further comprising the step of at least one of adding and subtracting at least one capacitor to a clocking circuit to adjust the frequency of the clocking signal based on an integrated circuit capacitance indicator during the first mode of operation.

* * * * *